United States Patent [19]

Chin et al.

[11] Patent Number: 5,627,139
[45] Date of Patent: May 6, 1997

[54] HIGH-TEMPERATURE SUPERCONDUCTING JOSEPHSON DEVICES HAVING A BARRIER LAYER OF A DOPED, CUBIC CRYSTALLINE, CONDUCTIVE OXIDE MATERIAL

[75] Inventors: David K. Chin, Kensington; Theodore Van Duzer, El Cerrito, both of Calif.

[73] Assignee: The Regents of the University of California, Oakland, Calif.

[21] Appl. No.: 407,043

[22] Filed: Mar. 17, 1995

Related U.S. Application Data

[63] Continuation of Ser. No. 183,581, Jan. 18, 1994, abandoned, which is a continuation of Ser. No. 864,122, Apr. 6, 1992, abandoned, which is a continuation of Ser. No. 586,693, Sep. 24, 1990, abandoned.

[51] Int. Cl.$^6$ .............................. H01L 39/22; H01L 39/00
[52] U.S. Cl. ........................ 505/238; 505/190; 505/329; 505/702; 257/35; 257/33
[58] Field of Search ............................. 357/4, 5; 257/31, 257/32, 33, 34, 35, 36; 505/190, 237, 238, 329, 702

[56] References Cited

U.S. PATENT DOCUMENTS

| | | | |
|---|---|---|---|
| 5,026,682 | 6/1991 | Clark et al. | 357/5 |
| 5,034,374 | 7/1991 | Awaji | 357/5 |
| 5,047,390 | 9/1991 | Higashino et al. | 357/5 |
| 5,101,243 | 3/1992 | Chi et al. | 357/5 |
| 5,106,819 | 4/1992 | Takemura | 357/5 |
| 5,106,823 | 4/1992 | Creuzet et al. | 357/5 |
| 5,128,316 | 7/1992 | Agostinelli et al. | 505/1 |

OTHER PUBLICATIONS

Schwartz et al. "The Observation of the AC Josephson Effect in a YBa2Cu3O7/Au/YBa2Cu3 O 7 Junction", IEEE Trans. on Magnetics, vol. 25, No. 2, Mar. 1989, pp. 1298–1300.

Johnson et al., "Gold", *Comprehensive Inorganic Chemistry*, vol. 3, 1973, pp. 129–131.

G. Linken et al., "Control of Growth Direction of Epitaxial YBaCuO Thin Films on SrTiO$_3$–Substrates", Solid State Communications, vol. 69, No. 3, pp. 249–253, 1989.

H.P.R. Frederikse et al., "Hall Mobility in SrTiO$_3$", Physical Review, vol. 161, No. 3, 15 Sep. 1967, pp. 822–827.

Kobayashi et al "Three Terminal YBaCuO Josephson Device with Quasi–Particle Injection Gate" IEEE Trans. on Mag. vol. 25(2) Mar. 1989 pp. 927–930.

Koch et al "Quantum Interference Devices made from Superconducting Oxide thin Films" *Appl. Phys Lett* vol. 51(3) Jul. 20, 1987 pp. 200–203.

Linker et al "Control of Growth Direction of Epitaxial YBaCuO Thin Films on SrTiO$_3$–Substrates" *Solid State Comm.* vol. 69 No. 3, 1989, pp. 249–253.

Takada et al "Tunnel junctions using oxide superconducting thin films epitaxially grown on SrTiO$_3$," *Appl Phys Lett* vol. 53 No. 26 Dec. 26, 1988 pp. 2689–2691.

*Principles of Superconductive Devices and Circuits*, "The General Josephson Junction: Circuit Applications," 1981, T. Van Duzer and C.W. Turner, pp. 164–169 and pp. 299–305.

S. Wolf and V. Kresin, "Novel Superconductivity," pp. 581–597, Lawrence Berkeley Laboratory of University of California, Berkeley.

Fabrication of Heteroepitaxial YBa$_2$Cu$_3$O$_{7-x}$–PrBa$_2$Cu$_3$O$_{7-x}$–YBa$_2$Cu$_3$O$_{7-x}$ Josephson Devices Grown by Laser Deposition, C.T. Rogers et al., Appl. Phys. Lett 55 (19), 6 Nov. 1989, pp. 2032–2034.

Controlled Preparation of all High–T$_c$ SNS–Type Edge Junctions and DC SQUIDs, J. Gao et al., University of Twenty, Faculty of Applied Physics, Physica C 171 (1990) 126–130, North–Holland.

*Primary Examiner*—Sara W. Crane
*Assistant Examiner*—Alice W. Tang
*Attorney, Agent, or Firm*—Fish & Richardson P.C.

[57] ABSTRACT

A HTSC Josephson device wherein the barrier layer is a cubic, conductive material.

20 Claims, 7 Drawing Sheets

Ver.: 5 mA/div.
Hor.: 5 mV/div.

Ver.: 0.2 mA/div.
Hor.: 0.05 mV/div.

HIGH-TEMPERATURE SUPERCONDUCTING JOSEPHSON DEVICES HAVING A BARRIER LAYER OF A DOPED, CUBIC CRYSTALLINE, CONDUCTIVE OXIDE MATERIAL

This is a continuation of application Ser. No. 08/183,581, filed Jan. 18, 1994, now abandoned which is a continuation of application Ser. No. 07/864,122 filed Apr. 6, 1992, now abandoned which is a continuation of application Ser. No. 07/586,693 filed Sep. 24, 1990, now abandoned.

BACKGROUND OF THE INVENTION

The present invention relates generally to integrated circuits, and more particularly to high-temperature superconducting Josephson devices useful in superconductive integrated circuits.

When a direct current (DC) voltage (V) is applied to two superconductors separated by a very thin oxide insulating layer, for example, under cryogenic conditions, the frequency of the alternating current (AC) voltage developed across the insulating gap is equal to 2 eV/h, where e is the electric charge and h is Planck's constant. Current flows through the insulator by tunneling. This effect is called the Josephson effect. Its applications include high speed switching of logic circuits and memory cells (well under 100 ps), parametric amplifiers operating up to at least 300 gigahertz (GHz), and maintenance of the U.S. legal volt at the National Bureau of Standards.

The Josephson junction is a thin barrier, such as an insulator, a metal or a semiconductor, separating two superconducting materials. This junction displays the Josephson effect. The Josephson devices used in integrated circuits are required to be controllable and repeatable. Also, they need to have a large product of critical current ($I_c$) and normal resistance ($R_n$) to be practical.

High-temperature superconducting or superconductor (HTSC) materials have been discovered whose transition to the superconducting state occurs at temperatures above 25 Kelvin (K). These HTSC materials include rare earth elements such as lanthanum and europium combined with barium and copper oxides. Another example of a HTSC material is the Y-Ba-Cu-O system. See J. G. Bednorz et al, Z. Phys., B 64, 189 (1986); and M. K. Wu et al, Phys. Rev. Lett. 908 (1987). These materials have critical temperatures of up to approximately 90 K or above. Other HTSC superconductors include BiSrCaCuO and TlBaCaCuO.

At present, most HTSC Josephson devices are native grain boundary junctions. They are neither controllable nor repeatable because of the nature of grain boundaries. It is impossible to use them for any complex circuit application. The best method to form junctions is to use an artificial barrier layer between two superconductor electrodes, as has been the case for niobium (Nb) integrated circuit technology. So far, only YBaCuO/Au/YBaCuO and YBaCuO/PrBaCuO/YBaCuO, which belong to this category, have been demonstrated. However, the resistivity of gold (Au) is too small so that $I_c R_n$ is too small to be useful. The YBaCuO/PrBaCuO/YBaCuO epitaxial trilayer devices are the only other ones which have potential for integrated circuit (IC) processes.

However, it has been observed that the PrBaCuO barrier layers have mixed a-axis and c-axis-oriented grains due to the anisotropic nature of the PrBaCuO crystal structure. Current flow across the junctions in the a-axis-oriented grains is much larger than in the c-axis-oriented grains. Nonuniformity of crystal orientation along the barrier layers will result in nonuniformity of critical current density along the barrier layers. This will affect the controllability and repeatability of the devices.

In view of the foregoing, an object of the present invention is to provide an improved HTSC Josephson device.

Another object of the present invention is to provide improved HTSC trilayer structures.

A more specific object of the present invention is to used doped strontium titanium oxide ($SrTiO_3$) as the barrier between HTSC electrodes to make Josephson devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a Josephson device having at least first and second layers of a high-temperature superconducting material separated by a barrier layer of a doped, cubic, conductive material which is lattice matched with the first and second layers. The superconducting material has a critical temperature greater than 25 K and the barrier layer may be doped-$SrTiO_3$.

A HTSC/doped-$SrTiO_3$/HTSC epitaxial trilayer structure can be used to form Josephson devices. The symbol SNS may be used to represent such devices wherein S is the HTSC material and N is the conductor barrier. The doped-$SrTiO_3$ in such devices is a degenerate semiconductor which is conductive. Both DC and AC Josephson effects may be produced. Josephson junctions are essential to superconductor electronics.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENT

Figure 1A:
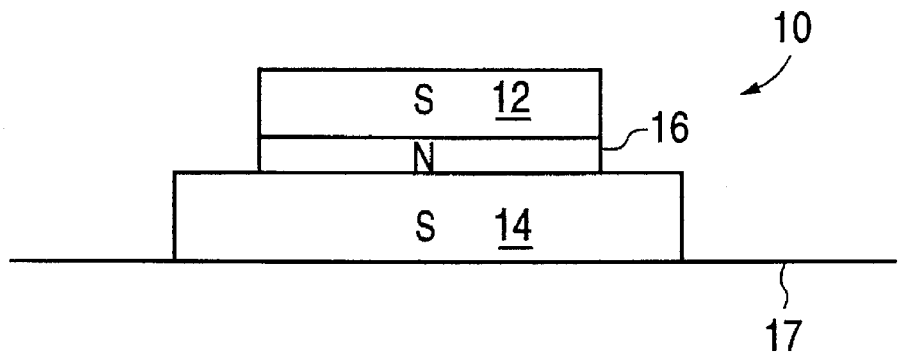
FIGS. 1(a)–(g) schematically illustrate various SNS devices in accordance with the present invention.

The basic concept of the present invention is to use doped, cubic (the crystal structure), conductive materials as the conductor barrier between high-temperature superconductor (HTSC) electrodes to make Josephson devices. The conductive materials must be lattice matched to the HTSC electrodes. The preferred barrier material is doped strontium titanium oxide (SrTiO3). In metallic-barrier Josephson junctions, for example, used heretofore, the coupling of wavefunctions between the electrodes is the result of leakage of superconducting electron pairs (the so-called "proximity effect") across the barrier. The superconductors which may be used in such devices include $Re_1Ba_2Cu_3O_{7-\delta}$, where Re is the rare earth element and $0<\delta<0.3$; BiSrCaCuO; and TlBaCaCuO.

There are many dopants for $SrTiO_3$ which may be used in the context of the present invention. The common ones for $SrTiO_3$ are niobium (Nb) and lanthanum (La). The techniques for obtaining superconductor thin films include sputtering, laser ablation, e-beam evaporation, molecular beam epitaxy, and metal-organic chemical vapor deposition. The $SrTiO_3$ can be deposited by the same techniques. Doping can be accomplished by adding the dopant with a certain concentration to the source of depositions mentioned above or by implanting the dopant after a pure $SrTiO_3$ film has been formed. Some extra processes may be required to activate all the dopant in the films. The reasons to use doped $SrTiO_3$ are discussed below.

$SrTiO_3$ has been used as a type of substrate for high-critical temperature ($T_c$) superconductor thin films. It is lattice-matched to the high-$T_c$ superconductors. It is important that the barrier layer in a sandwich junction be lattice-matched to the electrodes. The highest quality, high-temperature superconductor thin films are formed on lattice-matched crystalline substrates. Also the coefficient of thermal expansion of $SrTiO_3$ should be close to that of the high-$T_c$ copper-oxide superconductors so that film-stress related problems are minimize in the multilayer structure.

No interaction between the superconductors and $SrTiO_3$ is observed at the high temperatures required for the deposition of the superconductor and $SrTiO_3$ films. In sandwich junctions, the barrier layers should be as unreactive as possible to the base electrodes during barrier layer deposition, and to the base electrodes and counterelectrodes during counterelectrode deposition. Otherwise, shorts can be created between electrodes, or a new layer with different electrical properties can be present between the electrodes; both will affect the performance of the devices. The typical deposition temperatures for producing high-quality, high-temperature superconductor thin films and $SrTiO_3$ are around 700° C. It has been shown that $SrTiO_3$ does not react with YBaCuO up to 900° C. The contacts between the superconductor electrodes and the deposited $SrTiO_3$ will be metallurgical.

$SrTiO_3$ doped by certain elements can become conductive. It is conductive if doped with Nb and La. The resistivity decreases with the decrease of temperature. The resistivity of doped $SrTiO_3$ depends on the dopant concentration. At low dopant concentrations, the resistivity decreases with an increase in dopant concentration. Then it becomes constant at a certain doping level. Further increases in doped concentration will increase the resistivity. The concentration for the highest conductivity is about $10^{19}$ per centimeter cubic $(cm)^{-3}$.

Because $SrTiO_3$ is metallic when it is doped with Nb or La, its coherence length is relatively large. For a typical dopant concentration, the coherence length is about 8 nanometers (nm) at 77 K and 30 nm at 4.2 K. The critical current density of the devices is proportional to $$e^{\frac{-L}{\zeta_n}},$$

where L is the thickness of the barrier layer and $\zeta_n$ is the coherence length. A large $\zeta_n$ means that the thickness of the barrier can be large enough so that there are no pinholes between the electrodes and still there is a significant amount of critical current. A thicker barrier layer also brings about controllability and repeatability for the devices. Because of $SrTiO_3$'s relatively large resistivity compared to most normal metals, normal resistance of the junction is significantly larger than that of SNS junctions using normal metals as the coupling media. Since both its critical current and normal resistance are large, the $I_cR_n$ product is large. Because of the large $I_cR_n$ of devices of the present invention, the invention is significant to superconductive electronics.

Various Josephson devices in accordance with the present invention are shown in FIGS. 1(a)–(g) wherein like reference numerals refer to similar components. The films deposited may be either a-axis or c-axis oriented. It is a known fact that the coherence length of superconductors along the a-b planes is at least ten times of that along the c-axis (perpendicular to the CuO a-b planes). The proximity effect is mainly observed when current direction is in the a-b plane.

For the sandwich device 10 shown in FIG. 1(a), it is necessary to use a-axis oriented (a-b planes perpendicular to the surfaces) superconductor films 12 and 14 (S) separated by a conductor barrier 16 (N). The SNS structure is formed on a suitable substrate 17.

Figure 1B:
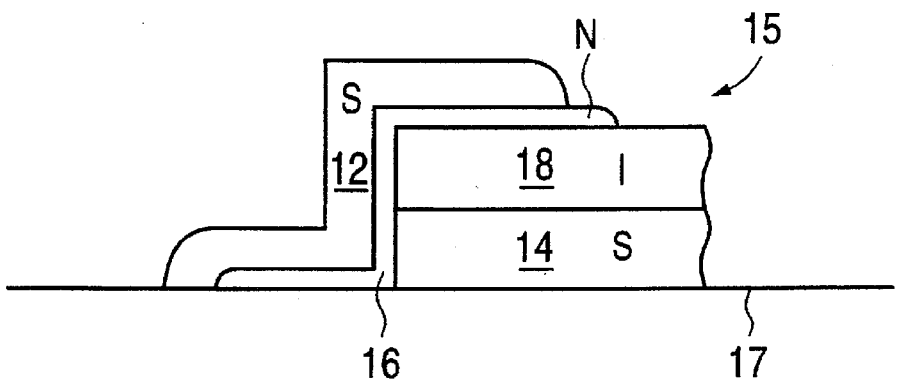

The edge junction structures 15 and 25 shown in FIGS. 1(b) and (d), respectively, can be used for c-axis oriented superconductor films. Layer 18 is an insulator (I) such as lanthanum aluminate (LaAlO3), magnesium oxide (MgO) or undoped $SrTiO_3$.

Figure 1C:
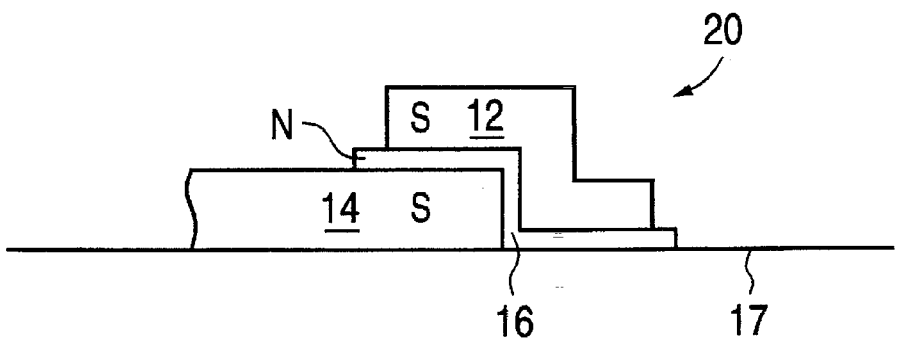
Figure 1D:
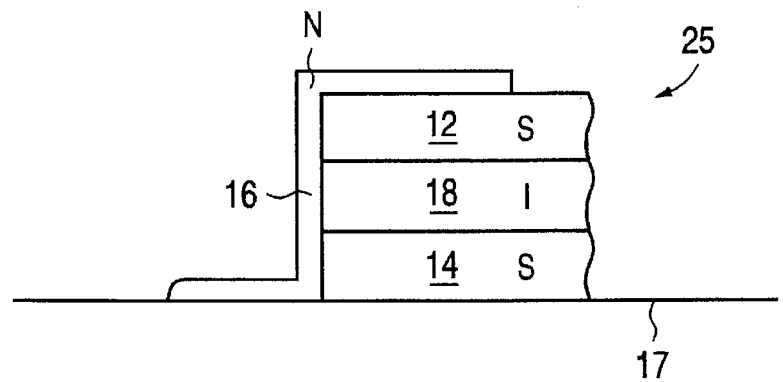
Figure 1E:
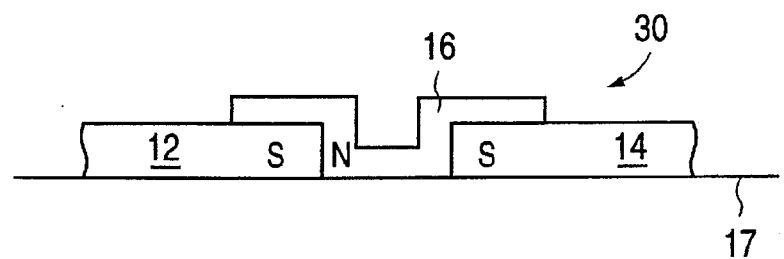

The coplanar devices or structures 20 and 30 shown in FIGS. 1(c) and 1(e) can be used for either c-axis or a-axis oriented superconductor films. If it is c-axis-oriented, the easy direction for current flow is parallel to the film surfaces. If the film is a-axis-oriented, current flows perpendicular to the film surface across the interfaces between the superconductors (S) and the doped $SrTiO_3$ (N).

Figure 1F:
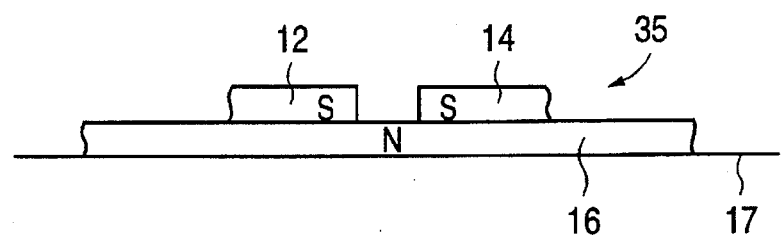
Figure 1G:
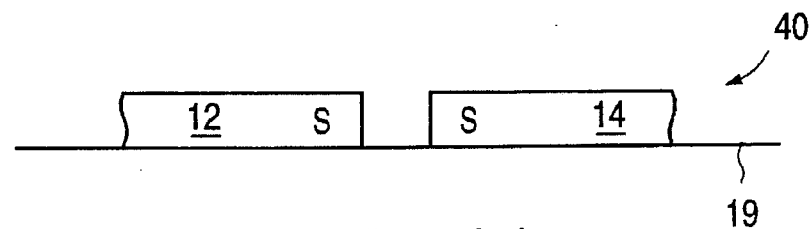

Another possibility, as shown in FIG. 1(f), includes device 35 wherein the superconductor electrodes 12 and 14 are coupled by a layer of doped-$SrTiO_3$ (N) underneath the electrodes. As shown in FIG. 1(g), still another possibility is structure 40 wherein electrodes 12 and 14 are coupled by a doped-$SrTiO_3$ substrate 19. Devices 35 and 40 are used for a-axis oriented superconductor films.

Figure 2:
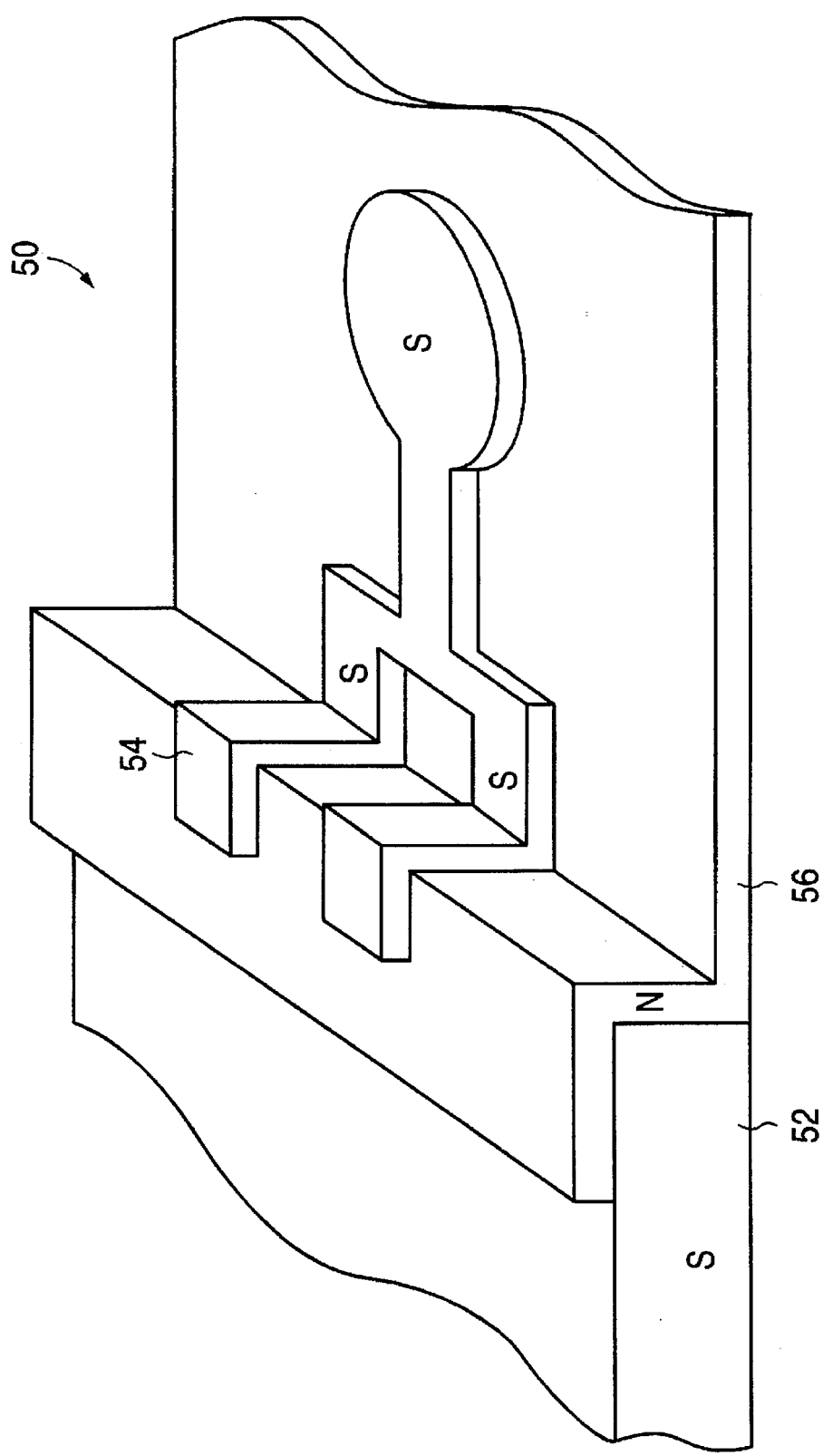
FIG. 2 is a schematic representation of a SQUID in accordance with the present invention.

Similarly, superconducting quantum interference devices (SQUIDs) can be made using the junctions shown in FIG. 1. As is known, a SQUID is a superconducting ring that couples with one or two Josephson junctions. SQUIDS may be used as high-sensitivity magnetometers and near-magnetic field antennas. An example of such a device 50 is shown in FIG. 2. Structure 50 includes HTSC layers (S) 52 and 54 separated by a conductive barrier layer (N) 56.

The thicknesses of the barrier layers N determine the characteristics of the devices. For thicker barriers, the normal resistance is larger and the critical current is smaller. Junctions with both low critical current and high critical current are useful in electronics. Typical critical current values lie between 0.1 milliamps (mA) and 10 mA.

To determine the principle of device operation, a YBaCuO/Nb-doped $SrTiO_3$/YBaCuO epitaxial trilayer structure may be used as a test structure. The YBaCuO layers (S) may be deposited by off-axis sputtering at a substrate temperature of 700° C. from a stoichiometric target. The Nb-doped SrTiO$_3$ film (N) is deposited by the same process with lower substrate temperature (680° C.). The sputtering target for Nb-doped SrTiO$_3$ is a stoichiometric target with 0.5% wt. Nb. The device configuration was the one shown in FIG. 1(c). The reason it was chosen is because such a structure would work for the devices with either c-axis oriented or a-axis oriented superconductor films. In the experiment, both (100) and (110) MgO and SrTiO$_3$ substrates were used. The films deposited on (100) substrates were c-axis oriented, and those deposited on (110) substrates were a-b oriented. The numbers (100) and (110) refer to the crystal orientation of the substrate.

Figure 3A:
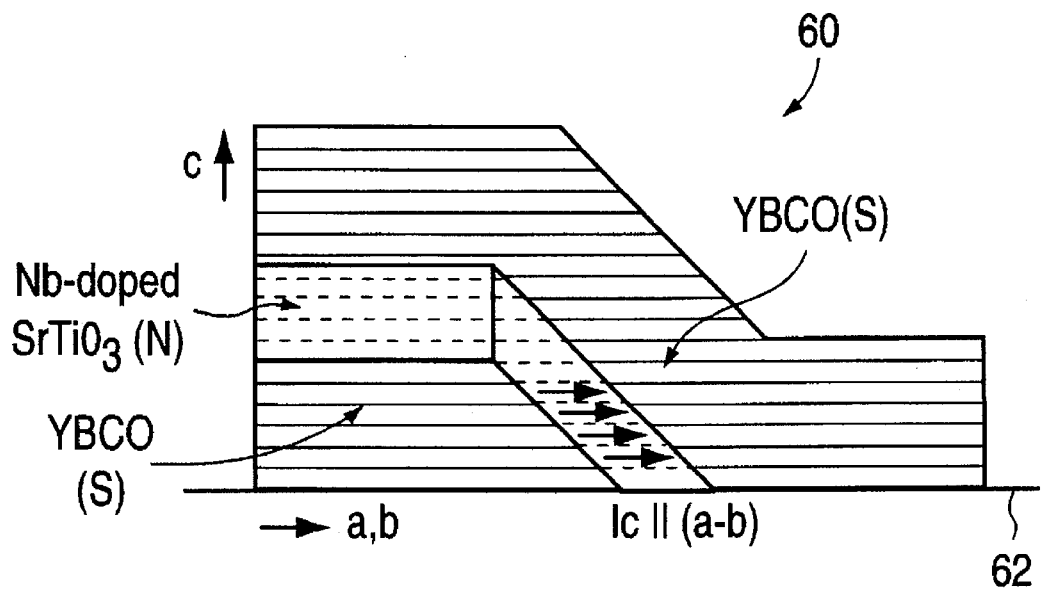
FIGS. 3(a) and (b) schematically illustrate current flow across SNS devices fabricated in accordance with the present invention.
Figure 3B:
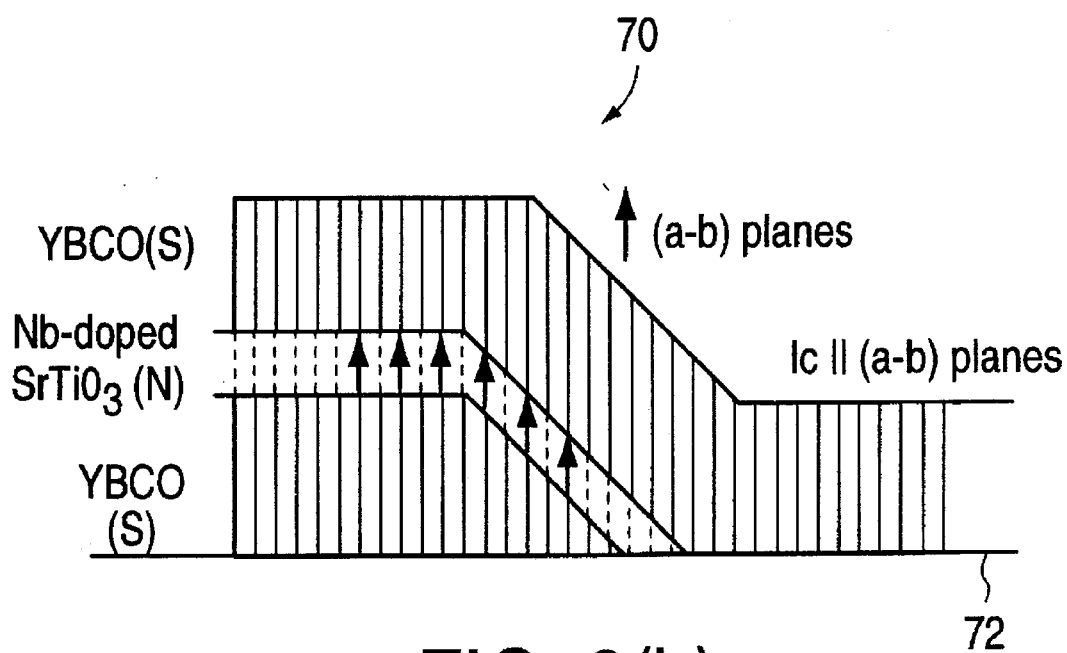

As shown in FIG. 3(a), for the device 60 fabricated on the (100) substrate 62, current flowed across the junction at the edges of the base electrodes (S) in the direction parallel to the surfaces of the substrate. As shown in FIG. 3(b), for the device 70 fabricated on the (110) substrate 72, current flowed across the junction in the direction normal to the substrate.

The entire fabrication process involved three micromachined silicon (Si) shadow masks. In future circuit applications, the device fabrication should be done using standard lithographic techniques to produce smaller, reproducible features.

Figure 4:
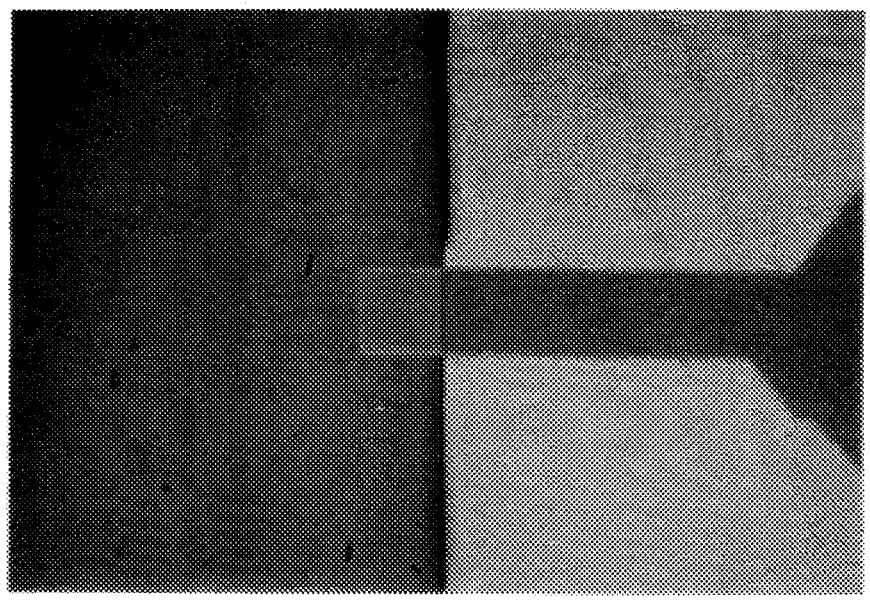
FIG. 4 is a pictorial representation of a device in accordance with the present invention.
Figure 5A:
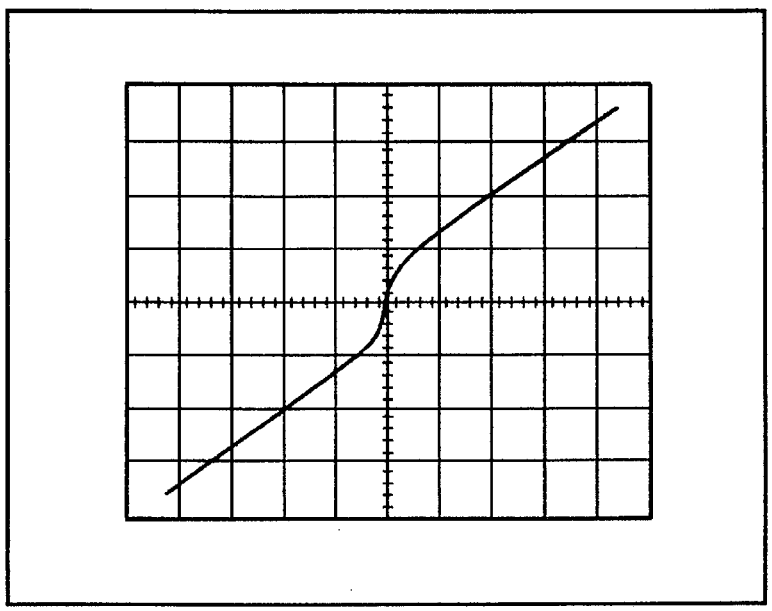
FIGS. 5(a) and (b) graphically illustrate the voltage and current characteristics of a device in accordance with the present invention.
Figure 5B:
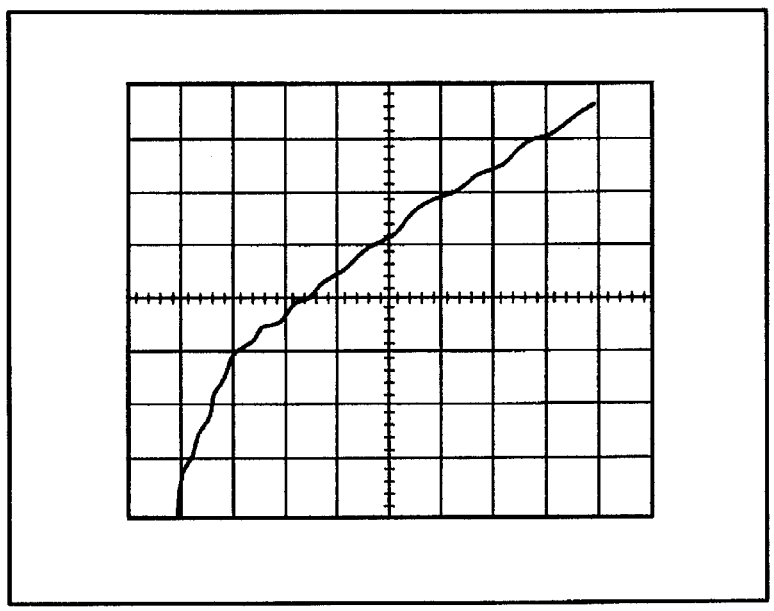
Figure 6:
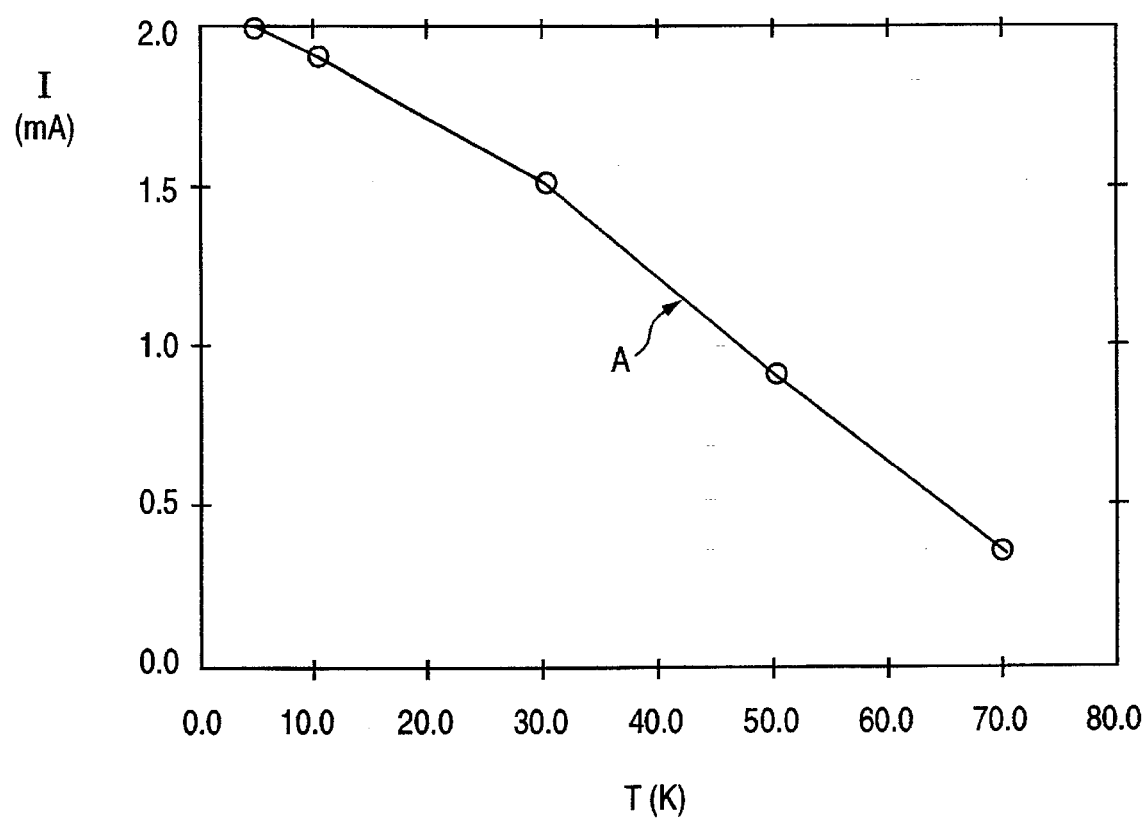
FIG. 6 graphically illustrates critical current versus temperature for a device in accordance with the present invention.

A micrograph of a fabricated device 20 (YBaCuO/Nb-doped SrTiO$_3$/YaBaCuO) (see also FIG. 1c) is shown in FIG. 4. The DC current-voltage (I-V) characteristic of the device with no rf signal applied at 4.2 K is shown in FIG. 5(a). The I-V characteristic of the device with microwave (7 GHz) irradiation at 4.2 K is shown in FIG. 5(b). It is clear that both DC and AC Josephson effects have been observed in the device. The temperature variation of the critical current ($I_c$) is shown in FIG. 6 (Curve A). The operating temperature of the device was as high as 80 K with nonvanishing zero-voltage current ($I_c$). It was limited by the critical temperature of the counterelectrode.

The high-temperature superconductor/doped-SrTiO$_3$/high-temperature superconductor epitaxial trilayer structure is the first high-$T_c$ SNS Josephson junction developed with a barrier layer which has the cubic crystal structure. Due to the isotropic nature of its cubic crystal structure, the crystal orientation will be uniform along the doped SrTiO$_3$ barrier layer. Consequently, the devices of the present invention will be more controllable and repeatable. Because of its relatively large normal resistance and critical current, the device has a large $I_cR_n$ product, which makes it practical for electronics applications. Also the device can operate at temperatures as high as the critical temperature of the superconductor electrodes, although operation is normally kept at somewhat lower temperatures. One of the important features of doped SrTiO$_3$ is that its dielectric constant is large (about 1000 at 77 K). It could be a disadvantage in certain applications.

There are other cubic materials which have the same crystal structure as SrTiO$_3$ but smaller dielectric constants. If they can be doped to form conductive crystals, they can also be used as the barrier layers for the HTSC Josephson devices.

The new features of the present invention include the use of doped SrTiO$_3$ as the normal metal barrier layer between two superconductor electrodes in a Josephson junction and various device structures utilizing superconductor/doped SrTiO$_3$/superconductor epitaxial trilayers. The devices have large $I_cR_n$ products as demonstrated above by the YBaCuO/Nb-doped SrTiO$_3$/YBaCuO devices. Also the devices can operate even at temperatures close to the critical temperatures of the superconductor electrodes.

The present invention has been described in terms of a preferred embodiment. The invention, however, is not limited to the embodiment depicted and described. Rather, the scope of the invention is defined by the appended claims.

What is claimed is:

1. A structure comprising:

first and second layers each including a high-temperature superconducting material including a copper oxide and having a critical temperature greater than 25 K; and a third layer connecting said first and second layers, said third layer including a conductive material having a cubic crystal structure which is lattice matched to said first and second electrodes; and wherein at least a portion of said third layer is underneath an epitaxial portion of said first layer; and a separation of said first and second layers is appropriate to produce a Josephson effect.

2. The structure of claim 1 wherein said conductive material is not a metal.

3. The structure of claim 1 wherein said conductive material includes oxygen.

4. The structure of claim 3 wherein said conductive material is doped and degenerate.

5. The structure of claim 4 wherein said conductive material is doped SrTiO$_3$.

6. The structure of claim 5 wherein said conductive material is doped with a material selected from the group consisting of niobium and lanthanum.

7. The structure of claim 5 wherein the superconducting material of said first layer and the superconducting material of said second layer have a-b planes and the a-b planes of the superconducting material of each of said first and second layers are oriented perpendicular to a substrate on which said first, second and third layers are located.

8. The structure of claim 5 wherein the superconducting material of said first layer and the superconducting material of said second layer each have a c-axis and the c-axis of the superconducting material of each of said first and second layers is oriented perpendicular to a substrate on which said first, second and third layers are located.

9. The structure of claim 5 wherein the superconducting material of each of said first and second layers is selected from the group consisting of Y$_1$Ba$_2$Cu$_3$O$_{7-\delta}$ and Re$_1$Ba$_2$Cu$_3$O$_{7-\delta}$, where $0<\delta<0.3$ and Re is a rare earth element.

10. The structure of claim 5 wherein the superconducting material of each of said first and second layers is selected from the group consisting of BiSrCaCuO and TlBaCaCuO.

11. A Josephson device comprising:

first and second electrodes each including a high-temperature superconducting material including a copper oxide and having a critical temperature greater than 25 K; and a barrier connecting said first and second electrodes, said barrier including a conductive material having a cubic crystal structure which is lattice matched to said first and second electrodes; and wherein at least a portion of said barrier is underneath an epitaxial portion of said first electrode; and a separation of said first and second electrodes is appropriate to produce a Josephson effect.

12. The Josephson device of claim 11 wherein said conductive material is not a metal.

13. The Josephson device of claim 11 wherein the superconducting material of said first electrode and the superconducting material of said second electrode have a-b planes and the a-b planes of the superconducting material of each of said first and second electrodes are oriented perpendicular to a substrate on which said electrodes are located.

14. The Josephson device of claim 11 wherein the superconducting material of said first electrode and the superconducting material of said second electrode each have a c-axis and the c-axis of the superconducting material of each of said first and second electrodes is oriented perpendicular to a substrate on which said electrodes are located.

15. The Josephson device of claim 11 wherein the superconducting material of each of said first and second electrodes is selected from the group consisting of $Y_1Ba_2Cu_3O_{-\delta}$ and $Re_1Ba_2Cu_3O_{7-\delta}$, where $0<\delta<0.3$ and Re is a rare earth element.

16. The Josephson device of claim 11 wherein the superconducting material of each of said first and second electrodes is selected from the group consisting of BiSrCaCuO and TlBaCaCuO.

17. The Josephson device of claim 11 wherein said conductive material includes oxygen.

18. The Josephson device of claim 17 wherein said conductive material is doped and degenerate.

19. The Josephson device of claim 18 wherein said conductive material is doped $SrTiO_3$.

20. The Josephson device of claim 19 wherein said conductive material is doped with a material selected from the group consisting of niobium and lanthanum.

* * * * *